United States Patent
Stevens et al.

(10) Patent No.: US 6,664,197 B2
(45) Date of Patent: *Dec. 16, 2003

(54) PROCESS FOR ETCHING THIN-FILM LAYERS OF A WORKPIECE USED TO FORM MICROELECTRONIC CIRCUITS OR COMPONENTS

(75) Inventors: E. Henry Stevens, Colorado Springs, CO (US); Richard Pfeiffer, Bigfork, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/999,112

(22) Filed: Nov. 1, 2001

(65) Prior Publication Data

US 2003/0027430 A1 Feb. 6, 2003

Related U.S. Application Data

(63) Continuation of application No. 09/160,522, filed on Sep. 24, 1998, now Pat. No. 6,331,490, which is a continuation-in-part of application No. 09/076,565, filed on May 12, 1998, now Pat. No. 6,376,374, and a continuation-in-part of application No. 09/041,901, filed on Mar. 13, 1998, now Pat. No. 6,350,319.

(51) Int. Cl.[7] .................. C09K 13/04; H01L 21/461
(52) U.S. Cl. .................. 438/754; 252/79.2; 252/79.4; 252/79.1; 438/745; 438/705; 438/703; 438/694

(58) Field of Search .................. 438/694, 703, 438/705, 745, 754; 252/79.2, 79.4, 79.1

(56) References Cited

U.S. PATENT DOCUMENTS

| | | | | |
|---|---|---|---|---|
| 4,952,275 A | * | 8/1990 | Lin et al. | 156/666 |
| 5,508,881 A | * | 4/1996 | Stevens | 361/305 |
| 5,736,002 A | * | 4/1998 | Allen et al. | 156/628.1 |
| 6,232,228 B1 | * | 5/2001 | Kwag et al. | 438/669 |
| 6,331,490 B1 | * | 12/2001 | Stevens et al. | 438/754 |
| 6,455,906 B2 | * | 9/2002 | Chen et al. | 257/412 |
| 2001/0003061 A1 | * | 6/2001 | Chen et al. | 438/655 |

OTHER PUBLICATIONS

Wolf et al., Silicon Processing for the VLSI Era, vol. 1: Process Technology, Latice Press, Sunset Beach, CA, USA, pp. 520–535, 1986.*

* cited by examiner

Primary Examiner—Nadine G. Norton
Assistant Examiner—Matthew A. Anderson
(74) Attorney, Agent, or Firm—Christensen O'Connor Johnson Kindness PLLC

(57) ABSTRACT

A process for removing at least one thin-film layer from a surface of a workpiece pursuant to manufacturing a microelectronic interconnect or component is set forth. Generally stated, the process comprises the oxidation of at least a portion of the at least one thin-film layer and the etching of the oxidized thin-film layer using an etchant that selectively etches primarily the oxidized thin-film layer.

20 Claims, 10 Drawing Sheets

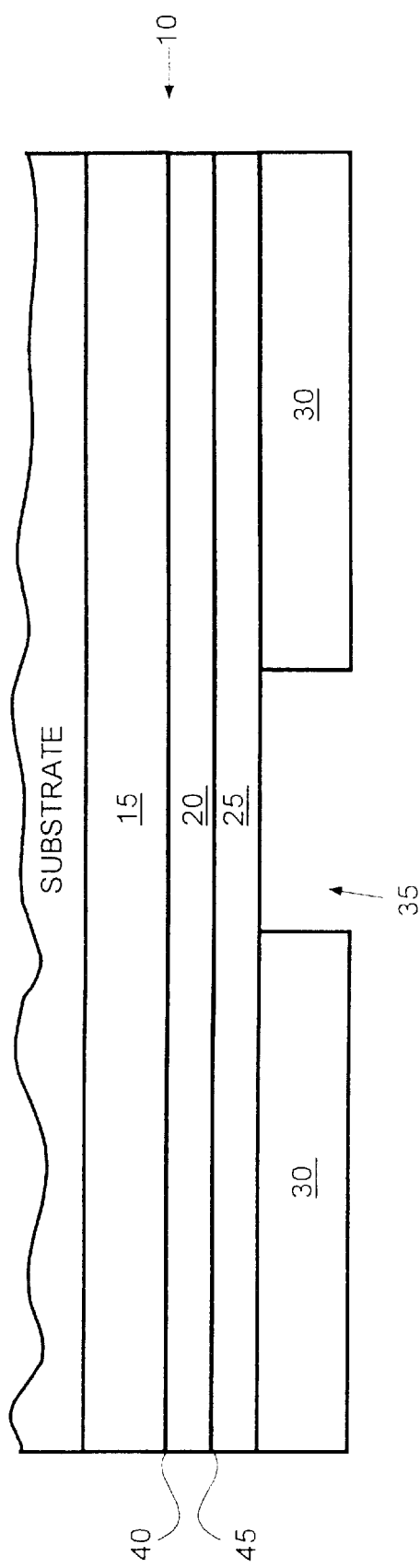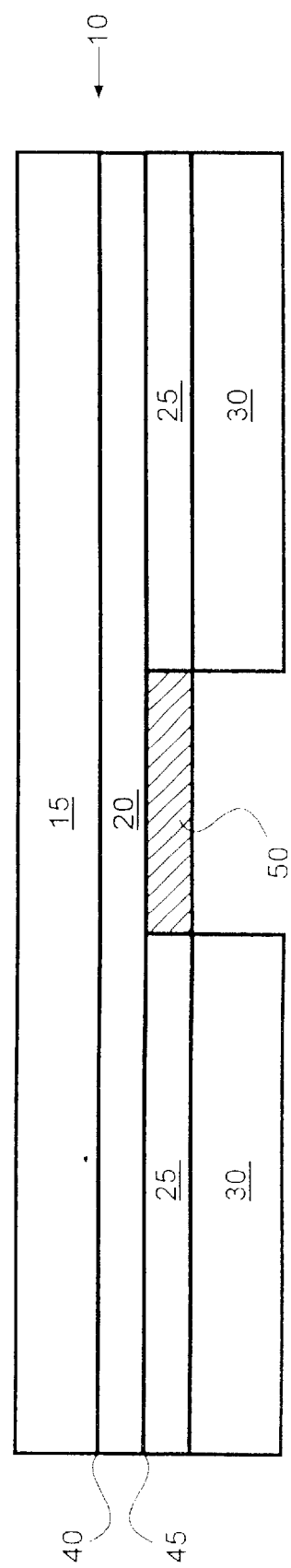

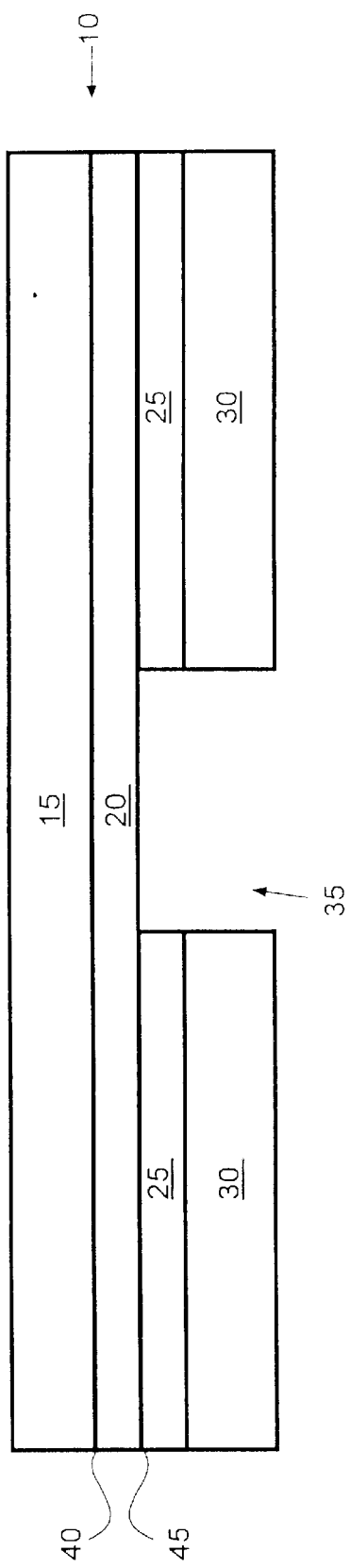
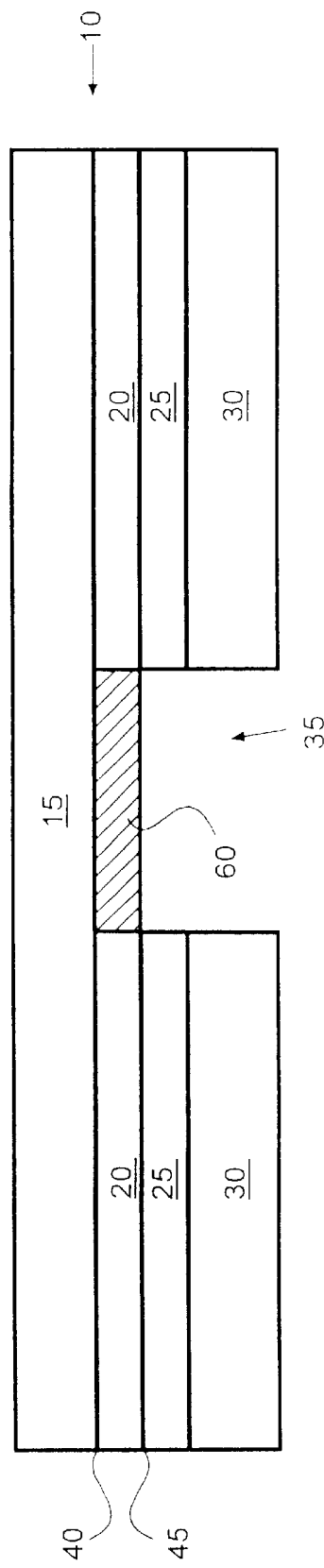

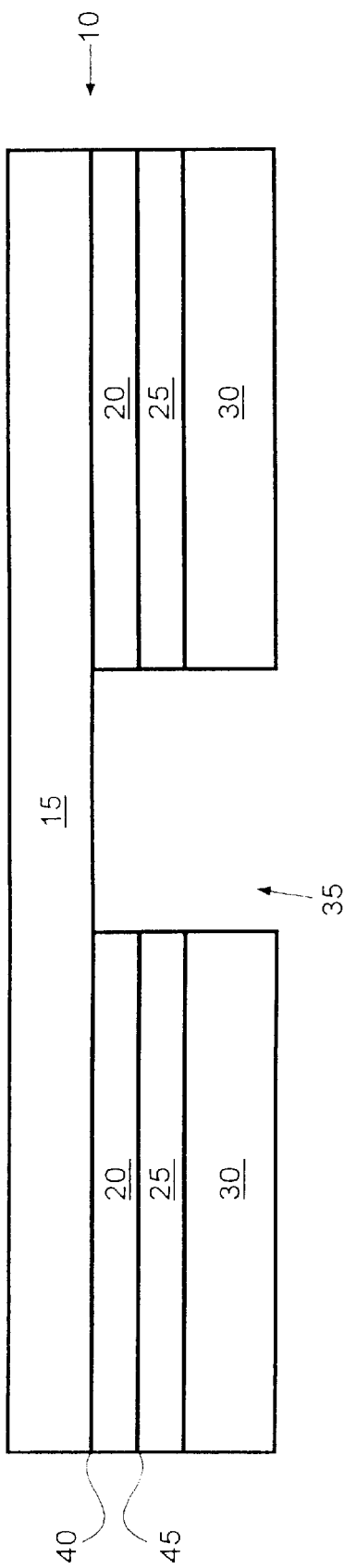
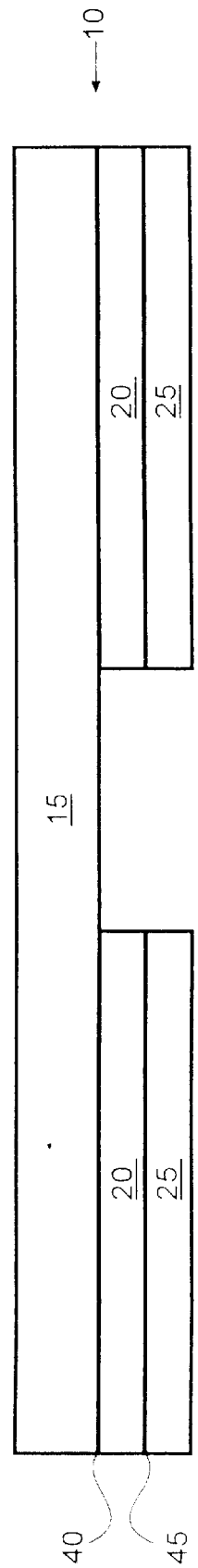

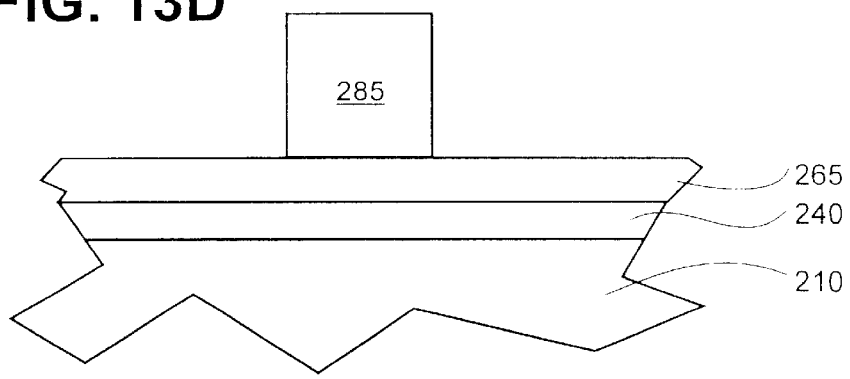
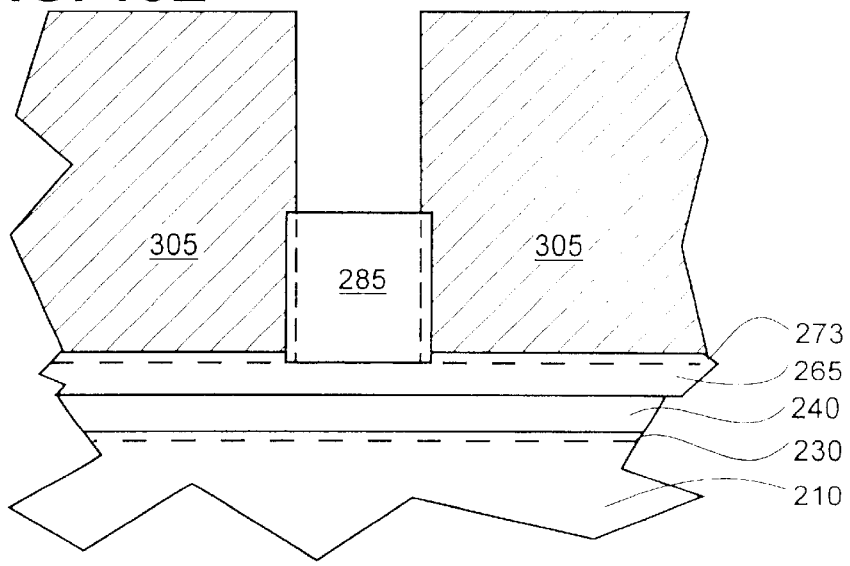
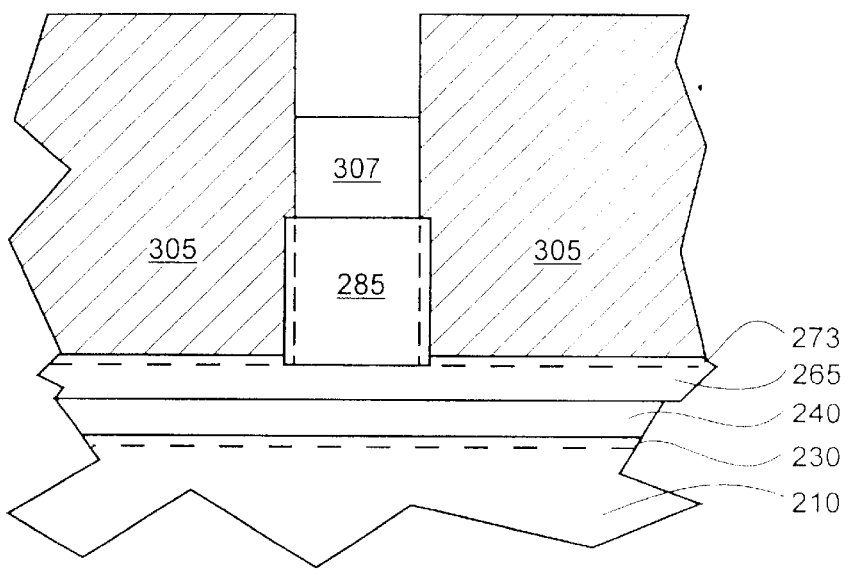

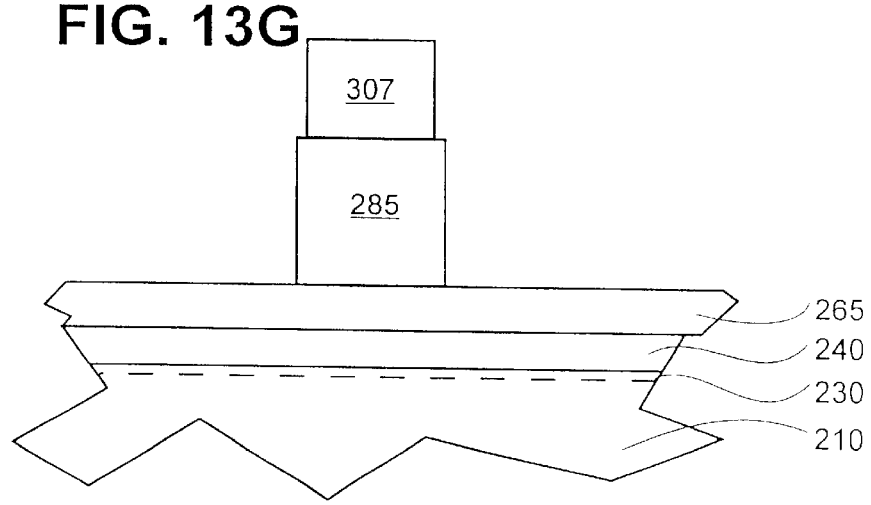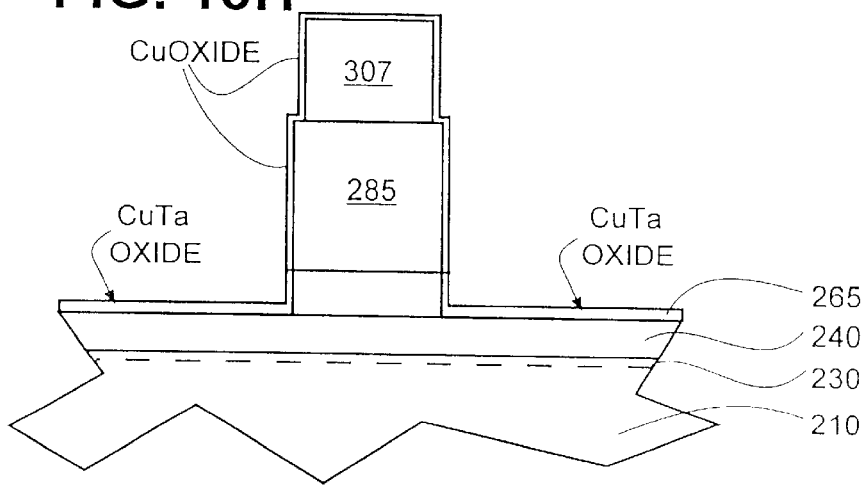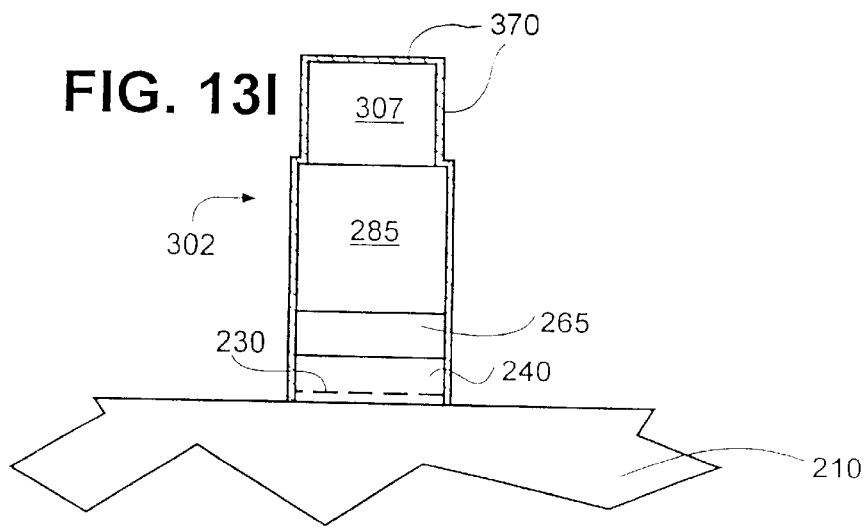

PROCESS FOR ETCHING THIN-FILM LAYERS OF A WORKPIECE USED TO FORM MICROELECTRONIC CIRCUITS OR COMPONENTS

CROSS-REFERENCE TO RELATED APPLICATIONS

This application is a continuation of U.S. Ser. No. 09/160,522, filed Sep. 24, 1998, now U.S. Pat. No. 6,331,490, which is a continuation-in-part of U.S. Ser. No. 09/076,565, filed May 12, 1998, now U.S. Pat. No. 6,376,374, and a continuation-in-part of U.S. Ser. No. 09/041,901, filed Mar. 13, 1998, now U.S. Pat. No. 6,350,319.

STATEMENT REGARDING FEDERALLY SPONSORED RESEARCH OR DEVELOPMENT

Not Applicable

BACKGROUND OF THE INVENTION

An integrated circuit is an interconnected ensemble of devices formed within a semiconductor material and within a dielectric material that overlies a surface of the semiconductor material. Devices that may be formed within the semiconductor material include MOS transistors, bipolar transistors, diodes and diffused resistors. Devices that may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

In a similar manner, metallized microelectronic components may be formed on semiconductor wafers or other substrates. Such microelectronic components include, for example, read/write heads, inductive components, capacitors, etc. Unlike the metallized interconnects described above, these microelectronic components include features that directly contribute to the operation of the circuit or device beyond mere interconnection of other components.

Recent technical advances have indicated that it is preferable to form metallized microelectronic components and interconnects from copper rather than the more traditional aluminum. In such microelectronic circuits, the copper is preferably isolated in the desired circuit region through the use of a barrier layer that impedes migration of copper to other areas of the circuit. Copper metallization structures are preferred to the more conventional aluminum structures because the resistivity of copper is significantly lower than that of aluminum.

There are numerous problems relating to the use of copper for these metallized structures that must be overcome before such copper metallized structures are commercially viable. Diffusion of copper is one such problem. Under the influence of an electric field, and at only moderately elevated temperatures, copper moves rapidly through silicon oxide. It is believed that copper also moves rapidly through low-$K_e$ dielectrics. Such copper diffusion causes failure of devices formed within the silicon.

Another problem is the propensity of copper to oxidize rapidly when immersed in aqueous solutions or when exposed an oxygen-containing atmosphere. Oxidized surfaces of the copper are rendered non-conductive and thereby limit the current carrying capability of a given conductor path when compared to a similarly dimensioned non-oxidized copper path.

A still further problem with using copper in integrated circuits and components is that it is difficult to use copper in a multi-layer, integrated circuit structure with dielectric materials. Using traditional methods of copper deposition, copper generally adheres only weakly to dielectric materials.

The semiconductor industry has addressed some of the foregoing problems in its efforts to make copper interconnects and components commercially viable. With respect to the problems associated with copper diffusion, barrier materials and corresponding structures have been developed to inhibit the diffusion. Such barrier materials include, for example, titanium nitride (TiN), and other refractory metal alloys. The barrier layer is interposed between the substrate and the copper interconnect or component. An adhesion-enhancing layer is often interposed between the barrier layer material and the copper interconnect or component. However, recent advances in electroplating chemistry by Semitool, Inc., have indicated that copper may be directly plated on the barrier layer material. Such advances are disclosed in U.S. Ser. No. 09/045,245, pending, filed Mar. 20, 1998, titled "Apparatus And Method For Electrolytically Depositing Copper On A Semiconductor Workpiece" (Attorney Docket No. SEM4492P0020US), which is hereby incorporated by reference.

Further advances in manufacturing commercially viable copper interconnects and/or components are disclosed in U.S. Ser. No. 09/076,565, pending, filed May 12, 1998, (Attorney Docket No. SEM4492P0051US), titled "Process And Manufacturing Tool Architecture For Use In The Manufacture Of One Or More Protected Metallization Structures On A Workpiece", which is hereby incorporated by reference. In accordance with the teachings of the foregoing patent application, copper interconnects and/or components are formed on a generally planar workpiece surface. This method of manufacturing such structures is in contrast to the more traditional dual-damascene formation process adopted in the semiconductor industry. In the latter process, the barrier layer material and copper metallization are driven into patterned recesses disposed in the workpiece surface. The deposition of such layers becomes quite difficult as component/interconnect geometries are reduced. Additionally, a processing step known as chemical-mechanical polishing (CMP) must be employed in this latter process. The CMP processing step removes those portions of the deposited barrier and/or metal layers that extend beyond the upper bounds of the patterned recesses. This processing step is often a source of device contamination and mechanical damage to the workpiece. The architecture disclosed in the foregoing patent application may be used to reduce and/or eliminate the need to deposit barrier and copper layers in small recessed geometries and, further, may reduce and/or eliminate the need for executing a CMP processing step in the interconnect/component formation.

In both the traditional dual-damascene process and the more advanced processes disclosed in the '565 application, there is a need to remove thin-film layers, such is the barrier layer and/or copper layer, from the surface of the workpiece. The thin-film layers may need to be removed in a blanket manner from the entire surface of the workpiece, or in a selective manner that leaves a predetermined pattern of the thin-film layers on the workpiece surface.

Removal of the thin-film layer may be problematic. For example, since copper does not form volatile halide compounds, direct plasma etching of copper cannot be employed in fine-line patterning of copper interconnects or components. As such, the present inventors have recognized that alternative processes for removing one or more thin-film layers are now needed if advanced, commercially viable copper interconnects and components are to become a reality. This need which the inventors have now recognize is addressed by the present invention.

BRIEF SUMMARY OF THE INVENTION

A process for removing at least one thin-film layer from a surface of a workpiece pursuant to manufacturing a microelectronic interconnect or component is set forth. Generally stated, the process comprises the oxidation of at least a portion of the at least one thin-film layer and the etching of the oxidized thin-film layer using an etchant that selectively etches primarily the oxidized thin-film layer.

Various embodiments of the processes are set forth. In accordance with one embodiment, the oxidizing and etching steps are executed in a generally concurrent manner. Alternatively, the oxidizing and etching steps are executed in a sequential manner and the etching step is executed in a generally non-oxidizing atmosphere.

Specific embodiments of processes are set forth that may be used in the manufacture of copper interconnects structures or devices on a workpiece such as a semiconductor wafer. In such embodiments, the thin-film layer is copper. The etching of the copper may be executed using an etchant comprising sulfuric acid. Likewise, the etching of the copper may be executed using an etchant comprising water, sulfamic acid, and iron (III) chloride. This latter etchant may also comprise further components such as a weak acid, a surfactant, and diethylene glycol butyl ether.

BRIEF DESCRIPTION OF THE SEVERAL VIEWS OF THE DRAWINGS

FIGS. 1, 2, 3, 4, 5, and 6 illustrate a cross-sectional view of a workpiece in various stages of processing in accordance with one embodiment of the present invention.

FIGS. 13A, 13B, 13C, 13D, 13E, 13F, 13G, 13H, 13I, illustrate an interconnect metallization structure formed using the process of FIG. 12 at various stages of the metallization level development.

DETAILED DESCRIPTION OF THE INVENTION

Figure 7:
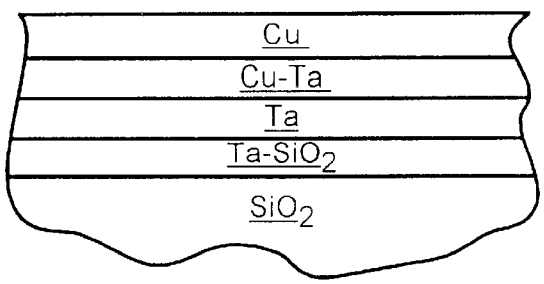
FIG. 7 is a cross-sectional view of a workpiece used by the present inventors in the testing of one embodiment of the present invention.

In the manufacture of microelectronic devices, such as integrated circuits, one or more metallization layers are formed on or in the workpiece to provide, for example, conductive paths between semiconductor components formed in the semiconductor wafer substrate. Such metallization may also be used to form discrete components, such as read/write heads, inductors, capacitors, etc., over semiconductor or non-semiconductor substrates. The processes set forth herein are applicable to the formation of a wide range of metallization structures used in microelectronic circuits, the foregoing being merely exemplary.

Irrespective of the particular use to which the metallization layer is destined, the layer must ultimately be present only at selected regions of the workpiece. Accordingly, it is necessary to limit deposition of the metallization layer to those selected regions or, alternatively, provide a blanket-like deposition and remove the metallization layer from regions other than those selected regions. The present inventors have recognized that the latter option is often preferable when attempting to form interconnect structures and/or metal components at the ever-decreasing dimensions required in modern microelectronic devices. The specific processes disclosed herein are particularly suitable for removing thin-films, such as those used to form metallization layers, from regions of the surface of the workpiece to thereby fabricate patterned thin-film structures.

FIGS. 1–6 illustrate a microelectronic workpiece, shown generally at 10, such as a semiconductor workpiece formed from a semiconductor wafer substrate, that may be subject to the processes of the present invention. For descriptive purposes, the processes of the present invention are disclosed in connection with the formation of copper interconnect structures and/or copper devices. However, it will be recognized that the processes of the present invention are also applicable to the fabrication of structures from other, thin-film material layers that, as will be explained in further detail below, are subject to oxidation. Further, although the workpiece 10 is illustrated in a process facedown orientation, other workpiece orientations may also be employed.

With reference to FIG. 1, the workpiece 10 is comprised of a plurality of thin-film layers. As shown, a dielectric layer 15 formed, for example, from silicon oxide, is disposed exterior to the substrate. A thin-film barrier layer 20 of a copper barrier material, such as tantalum, is disposed exterior to and, preferably, immediately adjacent the dielectric layer 15. As will be explained in further detail below, tantalum is a preferred barrier material as it can be oxidized and readily etched in accordance with the presently disclosed processes. If tantalum is used as the barrier layer material, the barrier layer 25 preferably has a thickness in the range of 0.02–1.0 micrometers.

A thin-film copper layer 25 is disposed exterior to and, preferably, immediately adjacent the barrier layer 20. Preferably, the copper layer 25 has a thickness in the range of 0.02–1.0 micrometers.

In the disclosed multilayer workpiece 10, a plurality of transition layers 40 and 45 are naturally formed at the interface between the tantalum barrier layer 20 and silicon oxide layer 15 and at the interface between the tantalum barrier layer 20 and copper layer 25, respectively. Transition layer 40 is comprised of a thin (e.g., 15–150 angstrom) Ta—Si$_x$O$_y$ material layer which progresses in composition from Ta at its lower surface through Ta—Si$_x$O$_y$ at its interior to SiO$_2$ at its upper surface. Similarly, transition layer 45 is comprised of a thin (e.g., 10–100 angstrom) Cu—Ta material which progresses in composition from Ta at its upper surface through Cu—Ta at its interior to Cu at its lower surface.

In the disclosed embodiment, the metallized interconnect or device is to be formed by patterning at least the copper layer 25. More preferably, the metallized interconnect structure or device is to be formed by patterning both the copper layer 25 and the tantalum layer 20, as well as the transition layers 40 and 45. To this end, a patterned mask layer 30 is disposed over the copper layer 25. The mask layer 30 includes one or more openings 35 therethrough which expose selected areas of the workpiece 10. The openings 35 overlie regions of the copper layer 25 and, if applicable, the tantalum layer 20 that are to be removed. Exemplary materials that may be used for the mask layer 30 include silicon oxide and silicon nitride.

To form the desired pattern in the copper layer 25, the copper layer is first subjected to an oxidant that oxidizes the copper to form copper oxide 50 at the exposed regions of the copper layer 25 proximate openings 35. The duration in which the copper layer 25 is exposed to the oxidant depends on the thickness of the layer 25 and, further, on whether the tantalum layer 20 is to be concurrently oxidized. FIG. 2 illustrates oxidation of the copper layer 25, oxidation of the tantalum layer 20 being undertaken in a separate step in the exemplary process. After subjecting the exposed regions of the copper layer 25 to the oxidant for the predetermined time duration, further oxidation may be inhibited by subjecting the workpiece 10 to an oxidant-free environment. This may be accomplished by subjecting the processing environment to a nitrogen purge, or the like.

After the thin-film layer, such as copper layer 25, has been selectively oxidized, it is subject to an etchant that selectively removes the oxidized material while leaving the non-oxidized portions of the layer relatively intact. It has been found that sulfuric acid meets the foregoing criterion when the thin-film layer is copper. If, as illustrated in FIG. 3, the mask layer 30 is not removed at this point in the process, then the etchant and mask material should be selected to prevent significant removal or deterioration of the mask layer 30. FIG. 3 illustrates the workpiece 10 after selective removal of the oxide material.

As noted above, it may be desirable to selectively remove portions of the barrier layer 20 along with the corresponding portions of the copper layer 25. Although it may be possible to selectively oxidize both layers concurrently as well as to subsequently remove both layers concurrently, the embodiment of the process disclosed in connection with FIGS. 1–6 addresses the removal of each of these layers individually. The selective removal of such layers in a serial fashion may be desirable when layers 20 and 25 cannot be concurrently oxidized and/or when the materials used to form layers 20 and 25 do not form oxides that are removable with the same etchant.

As illustrated in FIG. 3, removal of the oxidized portions of the layer 25 exposes the underlying portions of layer 20. If selective removal of the barrier layer 20 is also desired, the workpiece 10 is again subjected to an oxidant which results in the formation of an oxide material, such as $Ta_xO_y$, at the exposed regions of the layer proximate openings 35. The resultant oxide material is illustrated at 60 of FIG. 4. The duration in which the barrier layer 20 is exposed to the oxidant again depends on the thickness of the layer 20.

After the thin-film barrier layer 20 has been selectively oxidized, it is subject to an etchant that selectively removes the oxidized material while leaving the non-oxidized portions of the layer relatively intact. If, as illustrated in FIG. 5, the mask layer 30 is not removed prior to or at this point in the process, then the etchant and mask material should be selected to prevent significant removal or deterioration of the mask layer 30. FIG. 5 illustrates the workpiece 10 after selective removal of the oxide material.

After the oxidized portions of layer 20 have been removed by the etchant, the workpiece 10 is preferably subject to a rinse in deionized water. Further, the mask layer 30 is removed in a conventional manner. It should be noted, however, that the mask layer 30 may be removed at any portion of the foregoing process in which it is no longer necessary.

The exposed portions of layers 20 and 25 may be oxidized by subjecting them to one or more of a wide range of oxidizing materials and methods. Such materials and methods include the following:

exposure to air;

exposure to air at an elevated temperature;

exposure to an oxygen containing gas;

exposure to an oxygen containing gas at elevated temperature;

exposure to a heated jet of water with dissolved oxygen;

exposure to a jet of water with dissolved oxygen;

exposure to a mixture of water and ozone; and exposure to a mixture of water and ozone at an elevated temperature.

The layers 20 and 25 may also be oxidized in accordance with the teachings of U.S. Ser. No. 09/061,318, titled "Apparatus and Method for Delivering a Treatment Liquid And Ozone To Treat The Surface Of A Workpiece", filed Apr. 16, 1998 (Attorney Docket Number SEM4492P0140US).

Etching of the oxidized portions of layers 20 and 25 may take place by exposing the oxidized portions to one or more etchant materials. Such etchant materials and methods include the following:

exposure to a mixture of sulfuric acid and water;

exposure to a mixture of sulfuric acid, hydrochloric acid and water;

exposure to a mixture of hydrofluoric acid and water;

exposure to a mixture of water, $H_2O_2$, and $H_2SO_4$; and exposure to a mixture of water, $H_2O_2$, and $NH_4OH$.

Although the process steps described in connection with FIGS. 1–6 separate the oxidation and etching of the oxidized portions of a thin-film layer into two separate steps, the steps may be combined into a single step in which the oxidized portions are concurrently subject to both the oxidizing agent and the etchant. As such, the exposed portions of the thin-film layer are removed by the etchant as the exposed material of the layer is oxidized.

One chemical composition has proven to be particularly effective and the etching of copper. Generally stated, the composition includes deionized water, sulfamic acid, which is believed to function as a polishing agent, and iron (III) chloride, which is believed to function as an accelerant for the sulfamic acid/copper oxide reactions leading to the removal of the copper oxide. In a preferred form of the composition, a weak acid, such as acetic acid, butyric acid, formic acid, propionic acid, etc., is used to provide an acidic environment for the etching reactions. Further, the composition may include an additive, such as diethylene glycol butyl ether, that assists in removing non-water soluble materials from the surface of the workpiece. The diethylene glycol butyl ether may also function as a surfactant. A further surfactant, such as ICONOL NP-9, available from BASF, may also be added to the solution. Such surfactants aid in reducing the surface tension of the mixture thereby allowing it to enter into and react with materials in microchannel structures of the workpiece. In a preferred embodiment of the composition, the solution has the following approximate relative concentrations: acetic acid (10%), sulfamic acid (1.25%), iron (III) chloride (0.05%), diethylene glycol butyl ether (22%), and DI water (66.7%).

The foregoing solution has been used by the present inventors to remove copper seed layers from the bottom of trenches between copper lines. Seed layers have been removed from trenches down to about 0.4 micrometers. The seed layer has been cleanly removed from these trench bottoms with a minimum of over-etch.

It has been found that the foregoing solution may be used to etch copper in an ambient air environment. Alternatively, it may be used as an etchant in a separate etching step after an oxidation step.

Although the foregoing solution has been described in connection with the etching of thin-film copper layers, the solution has applicability to a broader range of workpiece processes. For example, the solution may be used as part of a semiconductor wafer cleaning process to remove metal contaminants. Such cleaning processes are executed at a number of points during the fabrication of integrated circuits and other microelectronic components.

The present inventors have tested the efficacy of the foregoing processes in the laboratory. To this end, they used test samples having the layer configuration illustrated in FIG. 7 (similar to the layer structure of FIGS. 1–6, but with the transition zones more clearly illustrated). The layer configuration was comprised of approximately 100–200 Å of copper disposed on approximately 200 Å of tantalum. The tantalum, in turn, was disposed on silicon oxide overlying a silicon wafer. Sheet resistance measurements indicated that the copper seed layer thickness varied by about 9% (standard deviation) across the wafer.

Figure 8:
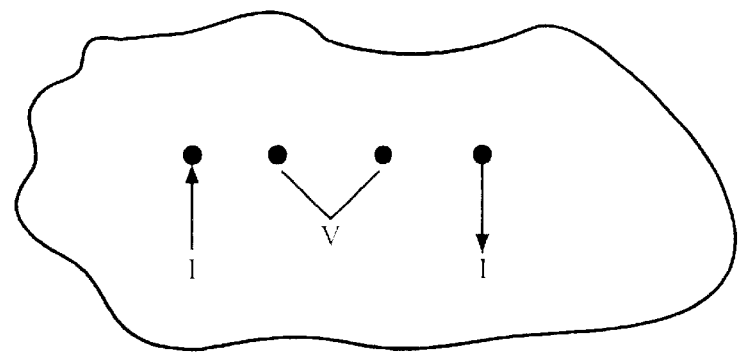
FIG. 8 is an illustration showing the probes used in the testing of the one embodiment of the present invention.

Sheet conductance was utilized to estimate etch rates. (Sheet conductance is the reciprocal of the typically measured sheet resistance.) As illustrated in FIG. 8, current I was applied through two outer probes and potential V was measured between two inner probes. Sheet conductance was then calculated as $g_s = c(I/V)$.

As illustrated in FIG. 7, the film structure includes several layers. Rather than being abrupt, the Cu—Ta transition is a thin (10 Å to 100 Å) layer, which progresses in composition from Cu at its upper surface through Cu—Ta in its interior to Ta at its lower surface. Likewise, the Ta—SiO$_2$ transition is a thin (15 Å to 150 Å) layer, which progresses in composition from Ta at its upper surface through Ta—Si$_x$O$_y$ in its interior to SiO$_2$ at its lower surface.

Sheet conductance is related to film structure by the following equation:

$$g_s = [\sigma_{Cu} h_{Cu} + \sigma_i h_i + \sigma_{Ta} h_{Ta} + \sigma_j h_j]$$

where:

$g_s$ is the sheet conductance, $\sigma_{Cu}$ is the conductivity of the copper layer, $\sigma_i$ is the average conductivity of the Cu—Ta transition layer, $\sigma_{Ta}$ is the conductivity of the tantalum layer, $\sigma_j$ is the average conductivity of the Ta—SiO$_2$ transition layer, $h_{Cu}$ is the thickness of the copper film, $h_i$ is the thickness of the Ci—Ta transition layer, $h_{Ta}$ is the thickness of the tantalum layer, $h_j$ is the thickness of the Ta—SiO$_2$ transition layer, and c is a constant (provided that probe spacing is small compared to probe distance from edges of the metal films).

Figure 9:
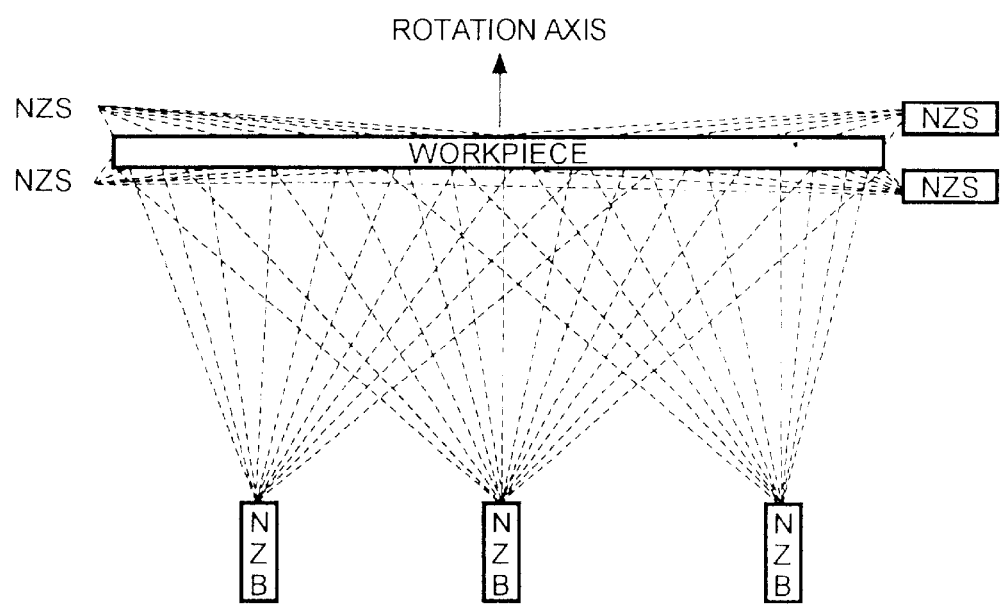
FIG. 9 is a schematic block diagram of an exemplary reactor that may be used to implement the processes of the present invention.

A wet-chemical-processing apparatus such as that illustrated in FIG. 9 was employed to etch the films. The elements labeled NZS are nozzles that may be employed to apply liquids, gasses or aerosols on surfaces and edges of a workpiece, such as the semiconductor wafer is used in the presently described tests. The elements labeled NZB are nozzles that may be employed to apply liquids, gasses or aerosols on a lower surface of the workpiece. Fluids at a prescribed temperature are supplied to the nozzles at a prescribed pressure. During a processing step, the workpiece may be stationary or it may be rotated about its axis at a prescribed rate for a prescribed time. One or more of such wet-chemical-processing apparatus may be incorporated in an automated tool such as the Equinox or LT-210 sold by Semitool, Inc. Further, although the apparatus is illustrated in connection with only a single wafer, a batch processing arrangement may also be utilized.

A representative recipe for etching metal films is given in Table 1 below. The oxidation/etch solution used in the tests was comprised of air and one or more acids dissolved in deionized (DI) water. The solution was sprayed on the piece lower surface in Step 2 of Table 1. Air was present in the enclosed apparatus chamber containing the wafer. Additional air was mixed with the ion in transit from nozzles to the workpiece.

The wafers were rotated during processing. For each process step of Table 1, the listed rotation rate was the steady-state value. Referring to Step 4, for example, the rotation rate begins at 2000 rpm and decreases to near 50 rpm at the end of this six second step. DI water for rinses was utilized at the supply-line temperature; thus, only a ten degree range is listed for Steps 5, 6, and 7. Referring to those steps that utilize air as the fluid, the listed value of 120 degrees for the air temperature is an approximate steady-state temperature of the air delivered to the nozzles.

TABLE 1

REPRESENTATIVE ETCH RECIPE

| Process Step | Fluid | Fluid Temp. (° C.) | Fluid Press. (psi) | Nozzles | Rotation Rate (rpm) | Duration (sec.) | Description |
| --- | --- | --- | --- | --- | --- | --- | --- |
| 1. | — | — | — | — | 2000 | 20 | Ramp Up |
| 2. | Etch Sol. | 28 | 30 | NZB | 2000 | 20 | Etch |
| 3 | Air | 120 | 40 | NZB | 2000 | 20 | Partial Dry |
| 4 | Air | 120 | 40 | NZB | 50 | 6 | Aspirate During Ramp Down |
| 5 | DI Water | 20–30 | 40 | NZS & NZB | 50 | 10 | Rinse in DI Water |

TABLE 1-continued

REPRESENTATIVE ETCH RECIPE

| Process Step | Fluid | Fluid Temp. (° C.) | Fluid Press. (psi) | Nozzles | Rotation Rate (rpm) | Duration (sec.) | Description |
| --- | --- | --- | --- | --- | --- | --- | --- |
| 6 | DI Water | 20–30 | 40 | NZS & NZB | 300 | 15 | Rinse in DI Water |
| 7 | DI Water | 20–30 | 40 | NZS & NZB | 50 | 5 | Rinse in DI Water |
| 8 | Air | ~120 | 40 | NZS & NZB | 100 | 4 | Aspirate |
| 9 | Air | ~120 | 40 | NZS | 2000 | 35 | Dry |
| 10 | Air | ~120 | 40 | NZS | 600 | 30 | Dry |

Figure 10:
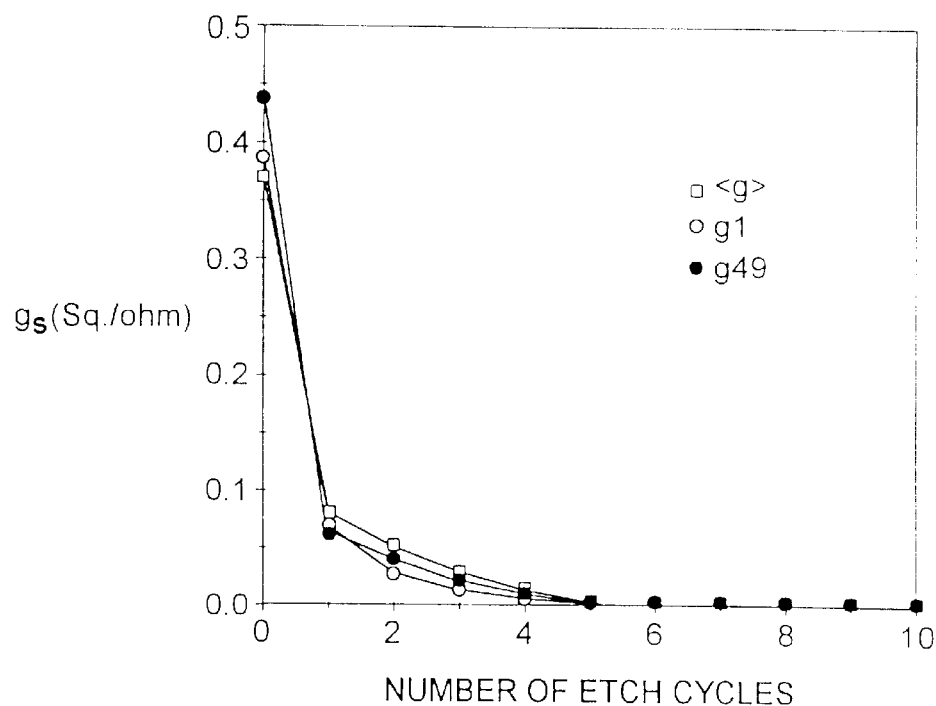
FIGS. 10 and 11 are graphs illustrating the results are tests performed by the present inventors.
Figure 11:
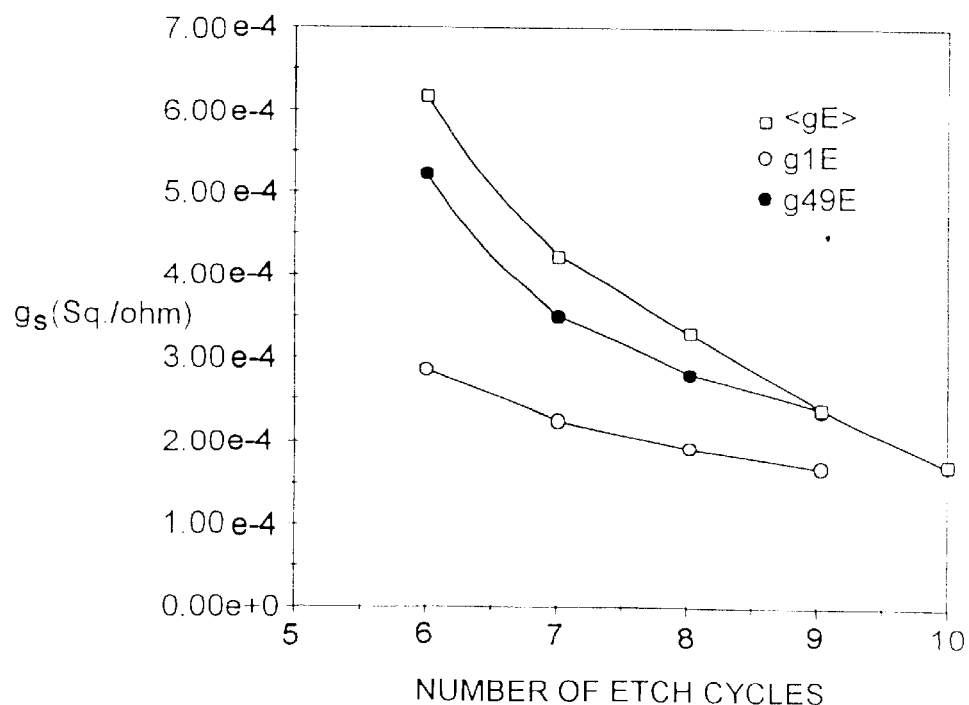

Representative results, which were obtained using the processing sequence of Table 1 to etch the film structure illustrated in FIG. 7, are shown in FIGS. 10 and 11. The etch solution for which the specific results are illustrated was comprised of 2 vol. % hydrofluoric acid in DI water. Sheet conductances were measured at 49 sites on the wafer. The measurements were taken before etching and after each cycle through the etch recipe of Table 1. Average sheet conductance, <g>, sheet conductance at site 1, $g_1$, and sheet conductance at site 49, $g_{49}$, are plotted versus number of cycles through the processing sequence in FIGS. 10 and 11. Referring to FIG. 10, the rapid decrease in sheet conductances after the first etch cycle indicates that the Cu layer was substantially removed by one cycle. Referring again to FIG. 10, the decrease in sheet conductances following each of cycles 2 through 5 is attributed to a decrease in thickness of the Cu—Ta and Ta layers. Referring now to FIG. 11, which shows some data from FIG. 10 at an expanded scale, the decrease in sheet conductances following each of cycles 6 through 10 is attributed to a decrease in thickness of the Ta—$SiO_2$ transition layer.

Again, as noted above, the mechanism for metal removal is believed to be formation of metal oxides followed by removal of the metal oxides by the hydrofluoric acid solution. When the etch solution is sprayed on the spinning workpiece in Step 2, a reactive layer of air and acid dissolved in DI water forms on the lower surface of the workpiece. During Step 3, the composition of the reactive layer changes due to evaporation of water, and within the duration of this step, a composition that is effective in removal of metals exists at the workpiece-reactive layer interface. Following metal removal, rinsing in DI water and drying in air are utilized to remove the reactive layer along with etch-reaction products.

Figure 12:
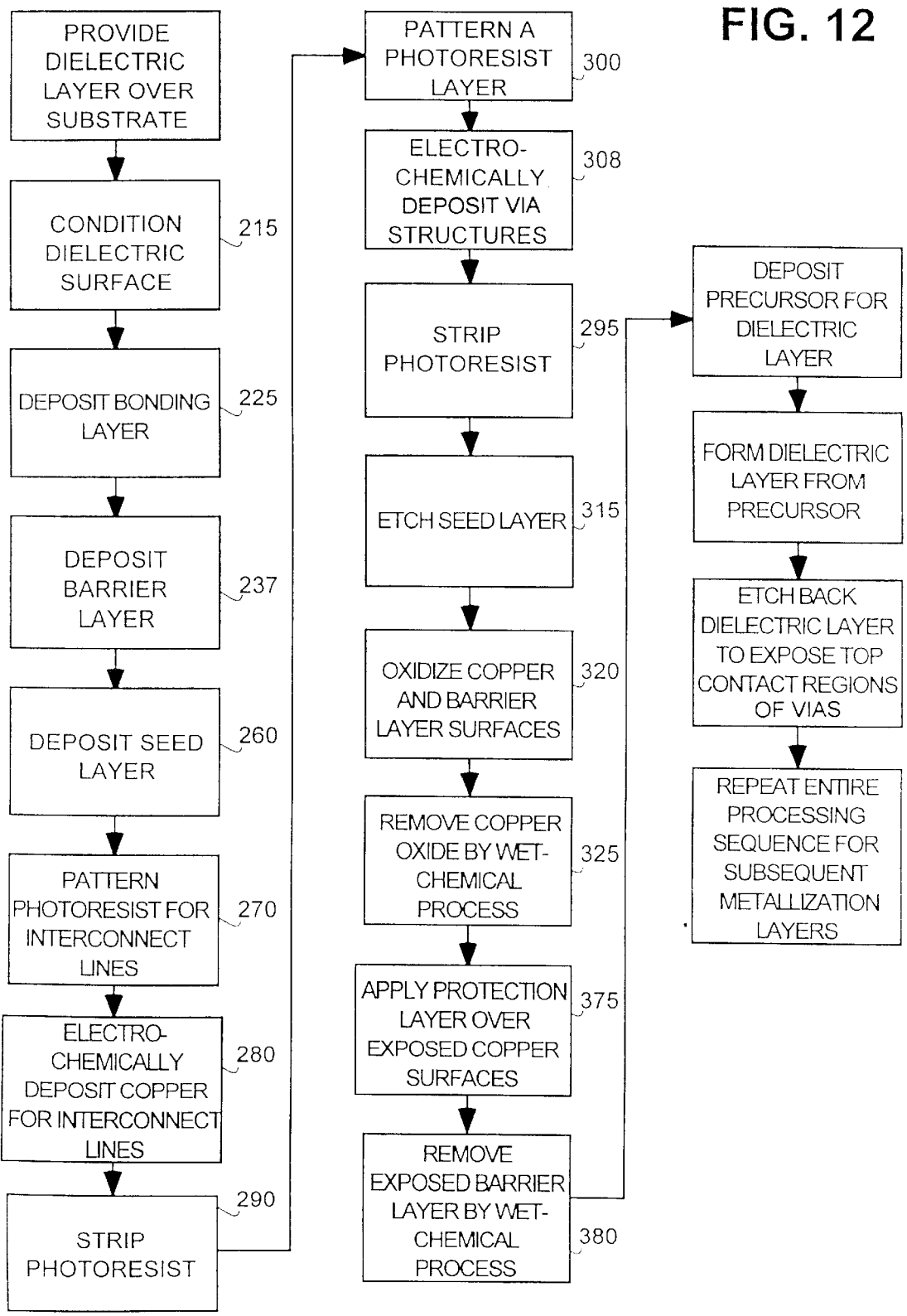
FIG. 12 is a process flow chart illustrating one manner of implementing an interconnect metallization that is fabricated in a process that includes one embodiment of the present invention.
Figure 13A:
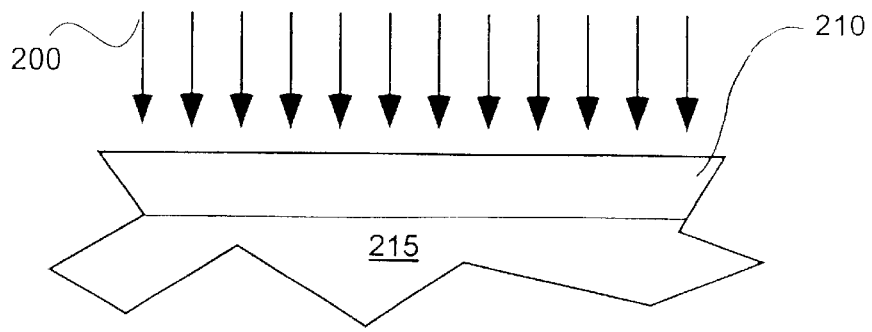

The foregoing etching processes may be integrated into a wide range of manufacturing processes for fabricating a metallization interconnect layer, or similar metallization structure or device. One embodiment of a basic manufacturing process employed to form a protected metallization structure is set forth in the flow chart of FIG. 12 while the corresponding formation of one embodiment of the metallization structure at various processing states is illustrated in FIGS. 13A–13K. As shown in FIGS. 12 and 13A, a generally planarized dielectric layer 210 is provided over a substrate 215, such as a semiconductor wafer. Although not specifically shown in FIG. 13A, the dielectric layer 210 likely includes contacts to metal-filled vias exposed at the top of the dielectric layer that have been generally planarized and that provide an electrical connection between one or more components below the surface of the dielectric layer. The one or more components below the surface of the dielectric layer may include a further interconnect metallization level, a direct connection to a semiconductor component formed in the substrate, etc. The dielectric layer 210 preferably has a relative permittivity of less than 4 and may be formed by spin application or spray application of a precursor material or precursor materials followed by a cure, in either an anaerobic or in an oxygen-containing atmosphere, at a temperature of less than 450° C. A preferred choice for the dielectric material is benzocyclobutene (BCB).

Preferably, the surface of the dielectric layer 210 is conditioned, as at step 215, to enhance the adhesion of a subsequently applied layer. The surface of the dielectric layer 210 may be conditioned using wet or dry chemical processes or through an ion milling process. The arrows 220 in FIG. 13A depict conditioning of the upper surface of the dielectric layer 210 by, for example, impinging argon or nitrogen ions. Alternatively, the upper surface may be conditioned by a brief (10 to 30 second) etch in a solution comprised of 1% to 2% hydrofluoric acid in deionized water.

Figure 13B:
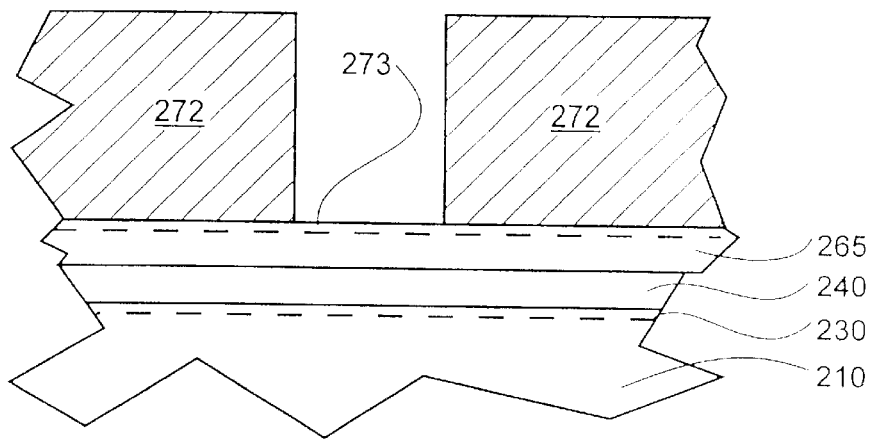

As illustrated at FIG. 13B and at step 225 of FIG. 12, an optional bonding layer 230 may be applied to the surface of the dielectric layer 210. The bonding layer 230 may be comprised of titanium, or chromium, which has been deposited using a vapor deposition technique such as PVD.

At step 237 of FIG. 12, a barrier layer 240 is deposited over the bonding layer 230, if used, or directly onto the surface of the dielectric layer 210. The barrier layer 240, as illustrated, is deposited over a generally planar surface of a semiconductor workpiece thereby eliminating the need to apply the barrier layer material into high aspect ratio trenches and vias. Depending on the properties of other materials incorporated within the interconnect structure, the barrier layer 240 may be comprised of tantalum, tantalum nitride, titanium nitride, titanium oxynitride, titanium-tungsten alloy, or tungsten nitride. A composite barrier comprised of two layers, as taught by Stevens in U.S. Pat. No. 4,977,440 and in U.S. Pat. No. 5,070,036 may be used for contact to semiconductor device terminals. It is further noted that a deposited bonding layer is not required to achieve acceptable adhesion between a tantalum barrier layer and a properly conditioned surface of a BCB dielectric layer 210.

The barrier layer 240 may be made to be sufficiently conductive to facilitate a subsequent electrochemical deposition process for depositing interconnect line and post metallization. However, if the conductivity of the barrier layer 240 is insufficient, a seed layer may be required.

FIG. 13B and step 260 of FIG. 12 illustrate application of a seed layer 265 that is deposited, for example, in a PVD or CVD process. The seed layer 265 is typically copper, but may also be comprised of metals such as nickel, iridium, platinum, palladium, chromium, vanadium or other conductive materials such as iridium oxide. Preferred thicknesses for the seed and barrier layers are in the range of 200 to 600 Å.

Referring again to FIG. 13B and step 270 of FIG. 12, procedures well-established in the photolithographic arts may be employed to deposit the interconnect line pattern using, for example, photoresist 272 as a mask. In such instances, a plasma treatment may be included as a final step in the photolithographic procedure or at any processing stage prior to the electrochemical deposition of the interconnect line metallization in order to remove photoresist residues from exposed portions of the seed layer surface. A treatment in HMDS may be employed to form a layer 273 that promotes adhesion between photoresist and the copper seed layer 265. Additionally, or alternatively, a thin (less than 100 Å) layer of copper oxide may be formed on the upper surface of the seed layer 265 to form layer 270 and thereby promote adhesion between the seed layer and photoresist.

Figure 13C:
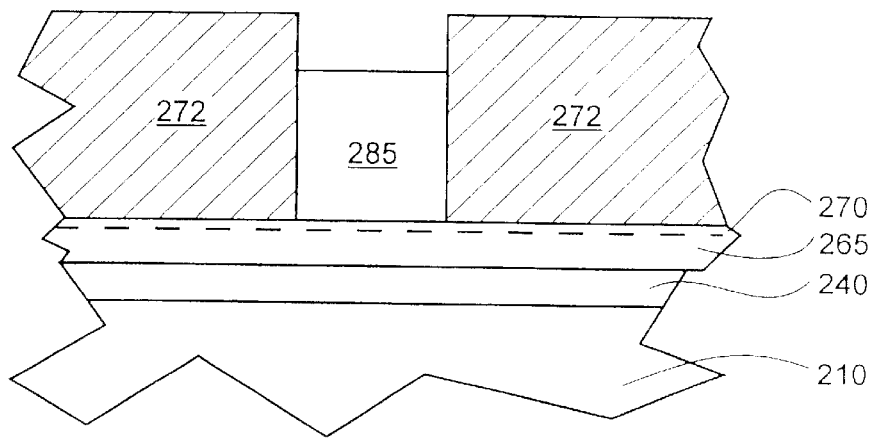

Referring to FIG. 13C and step 280 of FIG. 12, interconnect line metallization 285 is formed by selective electrochemical deposition of, for example, copper into the photoresist interconnect pattern. An acidic chemical bath is preferably employed for the electrochemical depositions. The chemical bath may be prepared by adding copper sulfate and sulfuric acid to deionized water. As is well known in the metals-plating arts, small concentrations of materials that affect metal grain size and film conformability may optionally be included in the chemical bath.

After the interconnect metallization 285 has been deposited into the photoresist interconnect pattern, the photoresist is removed. Removal of the photoresist may be accomplished by exposing the photoresist to a solvent or oxidant (such as ozonated DI water) followed by a rinse in water. Such a step is illustrated at steps 290 and 295 of FIG. 12 and should be sufficient to remove photoresist after selective metal depositions. The resultant structure is shown in FIG. 13D.

As illustrated in FIG. 13E and at step 300 of FIG. 12, a further photoresist pattern 305 is applied to the semiconductor workpiece in order to form openings through which the post metallization 307 may be electrochemically deposited as at step 308. A metallized post 307 is shown in FIG. 13F. After the post metallization has been deposited, the photoresist pattern is removed, thereby leaving the interconnect structure of FIG. 13G.

At this point in the process, there is a need to selectively remove the copper seed layer and barrier layer. This removal is particularly suitable for application of the thin-film etching processes and solutions disclosed above.

Referring now to FIG. 13H and to step 315 of FIG. 12, the seed layer 265 is partially or, preferably, substantially removed by an electrochemical etching process, by the thin-film etching processes disclosed above, or by a combination of electrochemical etching and the etching processes disclosed above. Electrochemical etching may be accomplished by exposing the seed layer to a suitable electrolyte solution, such as a solution containing phosphoric acid, while the seed layer 265 is held at a positive electrical potential relative to an electrode that is immersed in the electrolyte solution.

Shown in FIG. 13H is a representative cross section after substantial removal of the exposed seed layer by etching followed by formation of copper tantalum oxide on the exposed surface of the barrier layer and formation of copper oxide on exposed surfaces of lines and posts, the oxidation being accomplished in step 320. In the specific embodiment of the process disclosed here, the seed layer that remains after etching is converted to copper oxide. Significantly, it has been found that a copper seed layer deposited using, for example, a PVD process is removed at a rate equal to or greater than the removal rate of copper deposited using electrochemical deposition. With respect to selective removal of a copper seed layer, the composition including deionized water, sulfamic acid, and iron (III) chloride is the preferred etchant. In view of this selectivity, the duration in which the seed layer and copper structures are exposed to the etchant may be limited in a manner which allows substantially complete removal of the seed layer without undue etching of the electrochemically deposited copper structures. Even without such selectivity, controlled duration of the exposure may be used when the seed layer is substantially thinner than the deposited copper structures.

Referring to step 320, exposed surfaces of the copper structures 285, 307, and 265 and the barrier layer 240 are oxidized. As illustrated at step 325, the resultant copper oxide may be removed by exposure to an etchant solution, such as one of those described above. Again, although the oxidation and etching steps are illustrated as separate steps in the process, the oxidation and etching of the thin-film layers may occur in a concurrent manner.

Oxidation of the barrier layer and copper and the subsequent removal of the resulting copper oxide from the copper interconnect structure advantageously provides surfaces that can be selectively electroplated with a protective layer. In the disclosed structure, a protective layer is preferably provided on the interconnect structure 302, but is preferably not provided on the surface of the barrier layer. The formation of the copper oxide on the interconnect structure 302 and its subsequent removal leaves exposed conductive copper at the interconnect structure surface. The oxidation of the seed layer and barrier layer materials leaves a barrier layer surface comprised of non-conductive, copper-tantalum oxide. As a result of this processing, the surface of the interconnect structure 302 is readily subject to electroplating of a protective layer thereon, while the barrier layer is not.

A protective coating 370 is preferably provided over the remaining interconnect structures. Such a protective coating is preferably formed in an electrochemical process, such as at steps 375, that causes a material to deposit on the exposed copper but not on the oxide-coated, exposed barrier material. Materials for the protective coating preferably include those that impede copper migration into the dielectric and, further, which impede oxidation of the coated copper. Materials that may be employed for the protective coating include nickel, nickel alloys and chromium. Preferred thicknesses for the protective coating are in the range of 50 Å to 500 Å.

Referring to step 380 of FIG. 12, the barrier layer 240 and its overlying oxide layer may be removed where it is not covered by an overlying copper feature by the wet-chemical etch described above, provided that the barrier removal procedure does not excessively attack either copper features of the interconnect structure 302 or the dielectric 210 that underlies the barrier layer 240. The resultant structure is shown at FIG. 2I.

Figure 14:
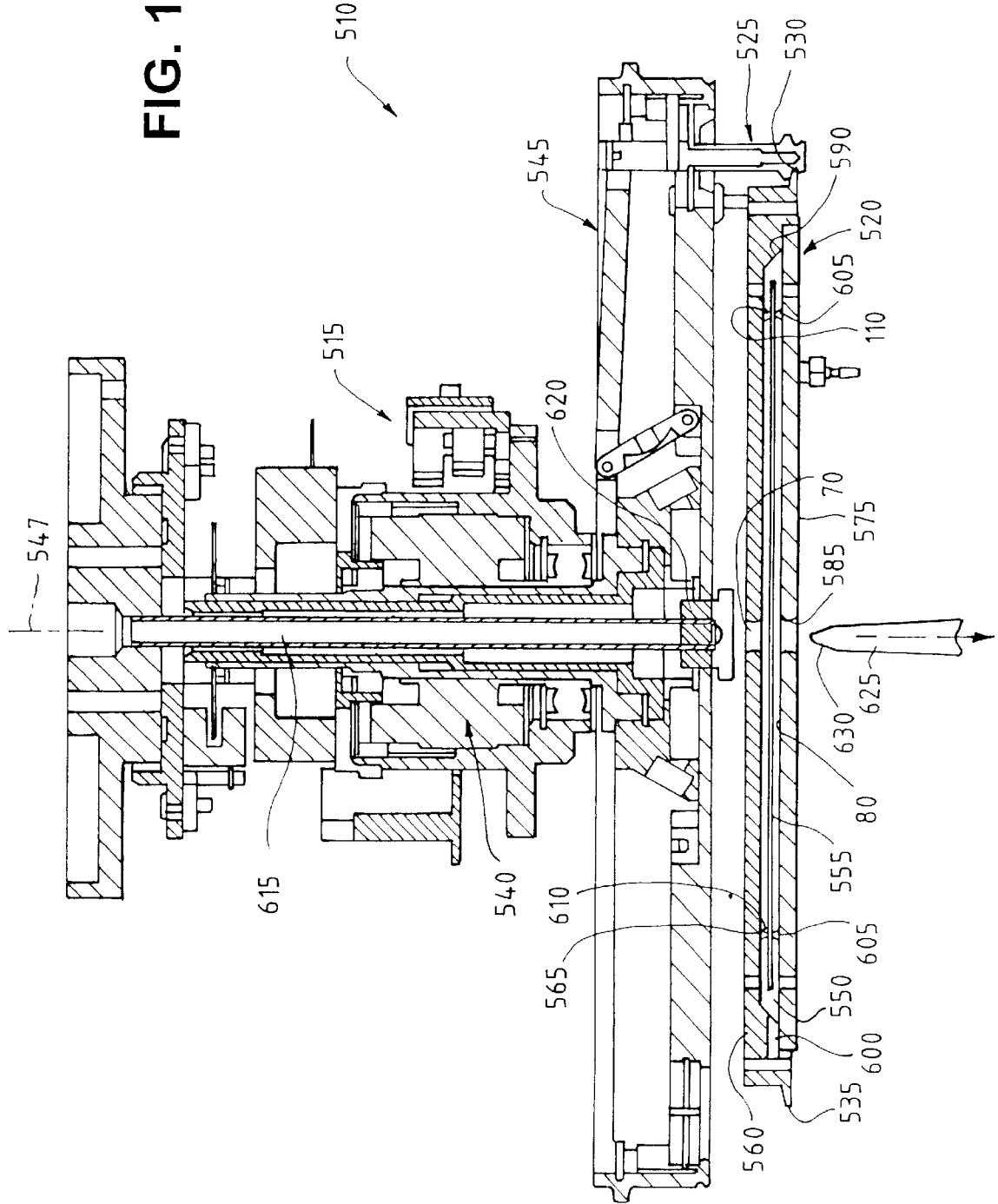
FIG. 14 illustrates a further exemplary reactor that may be used to implement the processes of the present invention.

FIG. 14 is a cross-sectional view of a further embodiment of a reactor, shown generally at 510, that may be used to implement the processes of the present invention. The embodiment of the reactor 510 of FIG. 14 is generally comprised of a rotor portion 515 and a workpiece housing 520. The rotor portion 515 includes a plurality of support members 525 that extend downwardly from the rotor portion 15 to engage the workpiece housing 520. Each of the support members 525 includes a groove 530 that is dimensioned to engage a radially extending flange 535 that extends about a peripheral region of the workpiece housing 520. Rotor portion 515 further includes a rotor motor assembly 540 that is disposed to rotate a hub portion 545, including the support members 525, about a central axis 547. Workpiece housing 520 is thus secured for co-rotation with hub portion 545 when support members 525 are engaged with flange 535. Other constructions of the rotor portion 515 and the engagement mechanism used for securement with the workpiece housing 520 may also be used.

The workpiece housing 520 of the embodiment of FIG. 14 defines a substantially closed processing chamber 550. Preferably, the substantially closed processing chamber 50 is formed in the general shape of the workpiece 555 and closely conforms with the surfaces of the workpiece. The specific construction of FIG. 14 includes an upper chamber member 560 having an interior chamber face 565. The upper chamber member 560 includes a centrally disposed fluid inlet opening 570 in the interior chamber face 565. The specific construction also includes a lower chamber member 575 having an interior chamber face 580. The lower chamber member 575 has a centrally disposed fluid inlet opening 585 in the interior chamber face 580. The upper chamber member 560 and the lower chamber member 575 engage one another to define the processing chamber 550. The upper chamber member 560 includes sidewalls 590 that project downward from the interior chamber face 565. One or more outlets 600 are disposed at the peripheral regions of the processing chamber 550 through the sidewalls 590 to allow fluid within the chamber 550 to exit therefrom through centripetal acceleration that is generated when the housing 520 is rotated about axis 547.

In the illustrated embodiment, the workpiece 555 is a generally circular wafer having upper and lower planar surfaces. As such, the processing chamber 50 is generally circular in plan view and the interior chamber faces 565 and 580 are generally planar and parallel to the upper and lower planar surfaces of the workpiece 555. The spacing between the interior chamber faces 565 and 850 and the upper and lower planar surfaces of the workpiece 555 is generally quite small. Such spacing is preferably minimized to provide substantial control of the physical properties of a processing fluid flowing through the interstitial regions.

The wafer 555 is spaced from the interior chamber face 580 by a plurality of spacing members 605 extending from the interior chamber face 580. Preferably, a further set of spacing members 610 extend from the interior chamber face 65 and are aligned with the spacing members 605 to grip the wafer 555 therebetween.

Fluid inlet openings 570 and 585 provide communication passageways through which one or more processing fluids may enter the chamber 550 for processing the wafer surfaces. In the illustrated embodiment, processing fluids are delivered from above the wafer 555 to inlet 570 through a fluid supply tube 615 having a fluid outlet nozzle 620 disposed proximate inlet 570. Fluid supply tube 615 extends centrally through the rotor portion 515 and is preferably concentric With the axis of rotation 547. Similarly, processing fluids are delivered from below the wafer 555 to inlet 585 through a fluid supply tube 625. Fluid supply tube 625 terminates at a nozzle 630 disposed proximate inlet 585. Although nozzles 620 and 630 terminate at a position that is spaced from their respective inlets, it will be recognized that tubes 615 and 625 may be extended so that gaps 635 are not present. Rather, nozzles 620 and 630 or tubes 615 and 625 may include rotating seal members that abut and seal with the respective upper and lower chamber members 560 and 575 in the regions of the inlets 570 and 585. In such instances, care should be exercised in the design of the rotating joint so as to minimize any contamination resulting from the wear of any moving component.

During processing, the processing fluids used in the foregoing processes are individually or concurrently supplied through fluid supply tubes 615 and 625 and inlets 570 and 585 for contact with the surfaces of the workpiece 555 in the chamber 550. The process fluids include the oxidant, etchant, or combined oxidant/etchant. Further, deionized water and/or nitrogen gas (or other non-reactive gas) may be selectively applied to the inlets 570 and 585. Selective supply of the processing fluids is accomplished through a fluid supply system (not shown).

Preferably, the housing 520 is rotated about axis 547 by the rotor portion 515 during processing to generate a continuous flow of any fluid within the chamber 550 across the surfaces of the workpiece 555 through the action of centripetal acceleration. Processing fluid entering the inlet openings 570 and 585 are thus driven across the workpiece surfaces in a direction radially outward from the center of the workpiece 555 to the exterior perimeter of the workpiece 555. At the exterior perimeter of the workpiece 555, any spent processing fluid is directed to exit the chamber 550 through outlets 600 as a result of the centripetal acceleration. Spent processing fluids may be accumulated in a cup reservoir disposed below and/or about the workpiece housing 520. Alternatively, the peripheral regions of the workpiece housing 520 may be constructed to effectively separate the processing fluids provided through inlet 570 from the processing fluids supplied through inlet 585 so that opposite surfaces of wafer 555 are processed using different processing fluids. In such an arrangement, the processing fluids may be separately accumulated at the peripheral regions of the housing 520 for disposal or re-circulation.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A process for removing at least one thin-film copper layer from a surface of a workpiece pursuant to manufacturing a microelectronic interconnect or component, the process comprising the steps of:
   oxidizing at least a portion of the at least one thin-film copper layer; and
   etching oxidized portions of the thin-film copper layer using an etchant comprising sulfamic acid and iron (III) chloride that selectively etches primarily the oxidized thin-film copper layer.

2. A process as claimed in claim 1 wherein the etchant further comprises a weak acid selected from the group consisting of acetic acid, butyric acid, formic acid, and propionic acid.

3. A process as claimed in claim 1 wherein the etchant further comprises a surfactant.

4. A process as claimed in claim 1 wherein the etchant further comprises diethylene glycol butyl ether.

5. A process for manufacturing a microelectronic interconnect or component formed of copper on a surface of a workpiece, the process comprising the steps of:
   depositing a copper seed layer over a surface of the workpiece;
   electrochemically depositing a patterned copper layer over portions of the copper seed layer;
   exposing portions of the copper seed layer and the patterned copper layer to an etchant for a predetermined period of time, the predetermined period of time being selected to allow substantial removal of portions of the copper seed layer by the etchant while preventing substantial removal of the electrochemically deposited patterned copper layer by the etchant.

6. A process as claimed in claim 5 wherein the exposing step comprises the steps of:
   oxidizing at least a portion of the seed layer and the deposited copper layer;
   etching oxidized portions of the seed layer and the deposited copper layer using an etchant that selectively etches primarily the oxidized portions of the seed layer and the deposited copper layer.

7. A process as claimed in claim 6 wherein the oxidizing and etching steps are executed in a generally concurrent manner.

8. A process as claimed in claim 6 wherein the oxidizing and etching steps are executed in a sequential manner and the etching step is executed in a generally non-oxidizing atmosphere.

9. A process as claimed in claim 5 wherein the etchant comprises sulfuric acid.

10. A process as claimed in claim 5 wherein the etchant comprises sulfamic acid and iron (III) chloride.

11. A process as claimed in claim 10 wherein the etchant further comprises a weak acid selected from the group consisting of acetic acid, butyric acid, formic acid, and propionic acid.

12. A process as claimed in claim 10 wherein the etchant further comprises a surfactant.

13. A process as claimed in claim 10 wherein the etchant further comprises diethylene glycol butyl ether.

14. A process as claimed in claim 5 wherein the etchant comprises hydrochloric acid.

15. A process as claimed in claim 5 wherein the etchant comprises 1–5% sulfuric acid by volume, 0.1–0.5% hydrochloric acid by volume, and water.

16. A process for manufacturing a microelectronic interconnect or component formed of a metal on a surface of a workpiece, the process comprising the steps of:
   depositing a metal seed layer over a surface of the workpiece using a first deposition process;
   depositing one or more metal structures over the metal seed layer through one or more patterned openings formed in at least one patterned mask overlying the seed layer using a second deposition process, the one or more metal structures having a thickness substantially greater than the thickness of the metal seed layer;
   removing the at least one patterned mask; and
   etching the metal seed layer and the one or more metal structures using an etchant that selectively etches the metal seed layer at a greater rate than the rate at which the etchant etches the one or more metal structures.

17. A process as set forth in claim 16 wherein the one or more metal structures are principally comprised of copper.

18. A process as set forth in claim 16 wherein the metal seed layer is principally comprised of copper.

19. A process as set forth in claim 16 wherein the first deposition process is a physical vapor deposition process.

20. A process as set forth in claim 16 wherein the second deposition process is an electroplating process.

* * * * *